United States Patent [19]

Maari et al.

[11] Patent Number: 5,818,762
[45] Date of Patent: Oct. 6, 1998

[54] MEMORY HAVING CHARGE-CARRYING FLOATING GATE MEMORY CELLS WITH TIME/VOLTAGE DEPENDENT REFRESH

[75] Inventors: Koichi Maari; Akira Tanaka, both of Kanagawa, Japan

[73] Assignee: Sony Corporation, Japan

[21] Appl. No.: 680,699

[22] Filed: Jul. 17, 1996

[30] Foreign Application Priority Data

Jul. 19, 1995 [JP] Japan ................................. 7-183075

[51] Int. Cl.$^6$ .................................................. G11C 11/34
[52] U.S. Cl. ........................... 365/185.25; 365/185.01; 365/185.18; 365/185.24
[58] Field of Search ....................... 365/185.25, 185.18, 365/185.24, 185.01

[56] References Cited

U.S. PATENT DOCUMENTS

| | | | |
|---|---|---|---|
| 5,394,359 | 2/1995 | Kowalski | 365/185 |
| 5,511,020 | 4/1996 | Hu et al. | 365/185.28 |
| 5,515,327 | 5/1996 | Matsukawa et al. | 365/203 |
| 5,532,959 | 7/1996 | Ninomiya et al. | 365/185.3 |
| 5,574,684 | 11/1996 | Tomoeda | 365/185.04 |

*Primary Examiner*—David C. Nelms
*Assistant Examiner*—Hien Nguyen
*Attorney, Agent, or Firm*—Ronald P. Kananen

[57] ABSTRACT

A non-volatile memory device provided with a memory cell having a charge storage layer with a threshold voltage which changes in accordance with an amount of charge stored wherein one value from a plurality of possibles values is written into the memory cell, comprising an auxiliary internal power source; a means for adjusting an amount of charges stored by the charge storage layer in accordance with a state of application of the voltage; a time counting means for counting a time elapsed from when a final write operation is carried out with respect to the memory cell; and a refreshing means for comparing the time counted by the counting means and a preliminarily set charge holding time limit, supplying the voltage of the auxiliary internal power source to the memory cell when the counted time reaches the charge holding time limit, and performing a repeat write operation.

12 Claims, 14 Drawing Sheets

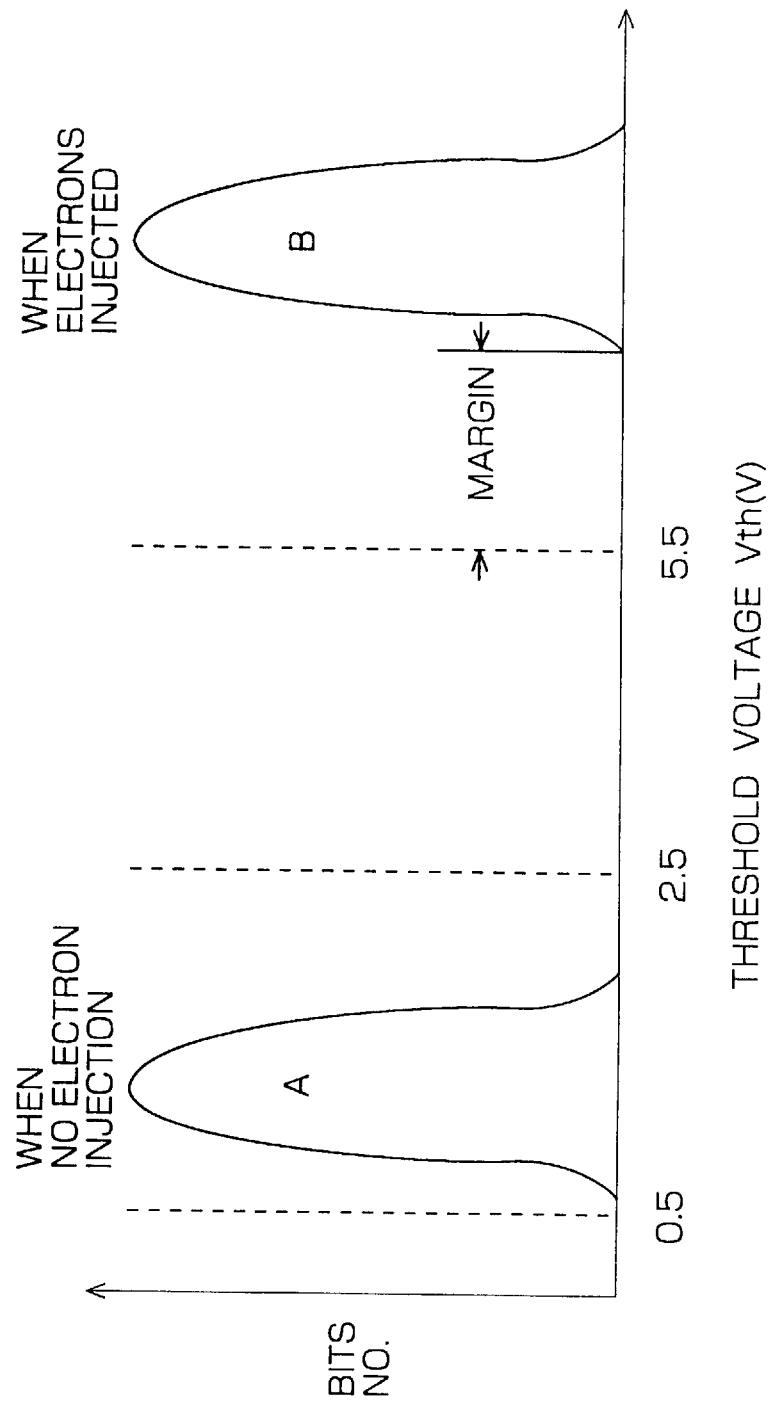

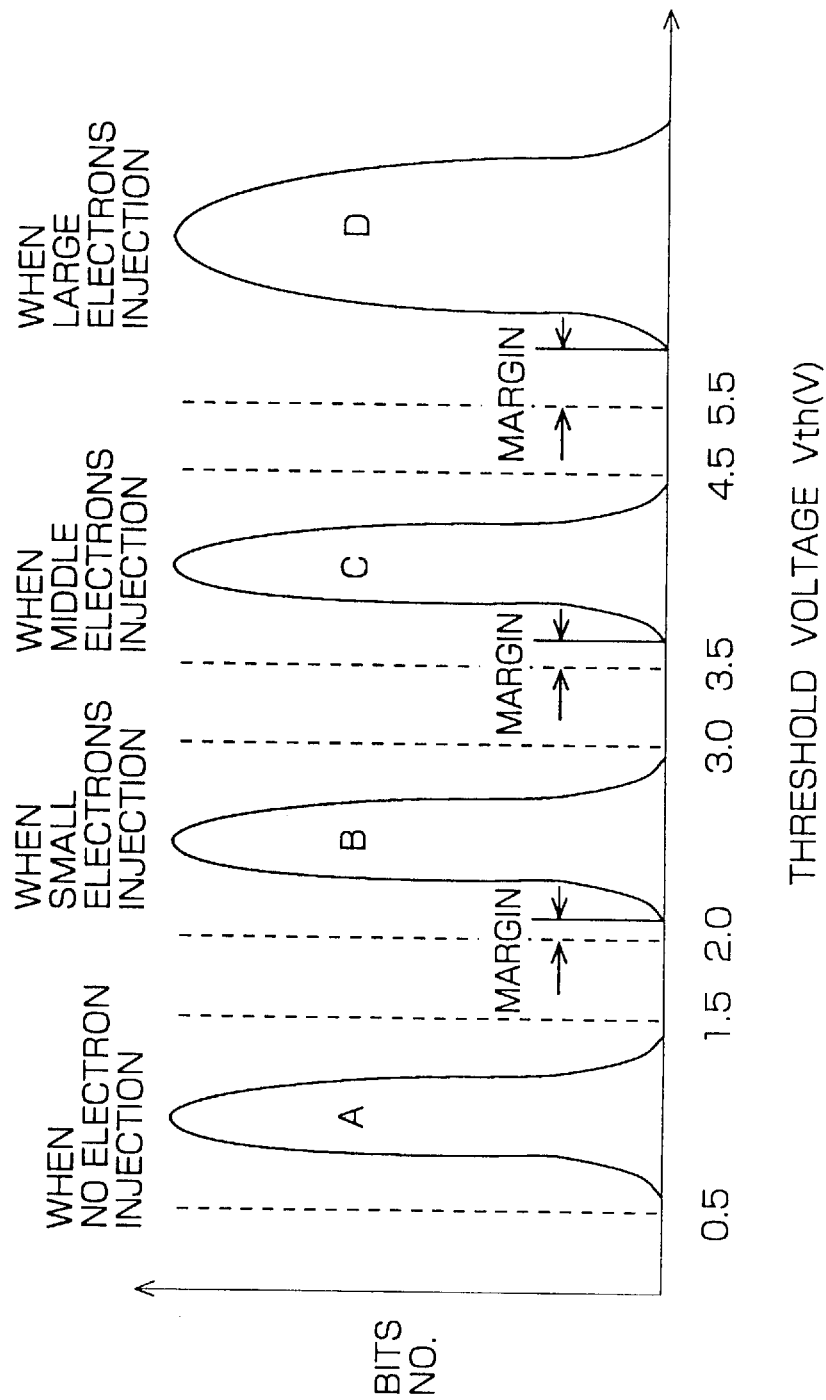

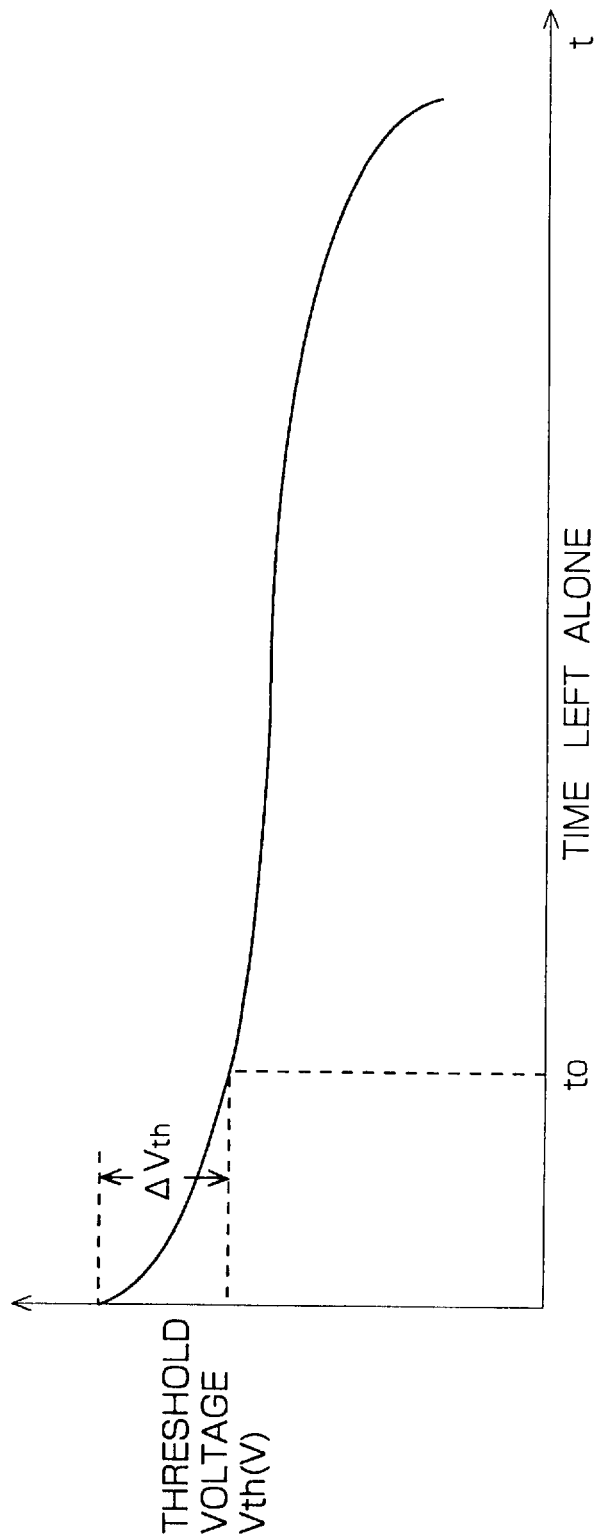

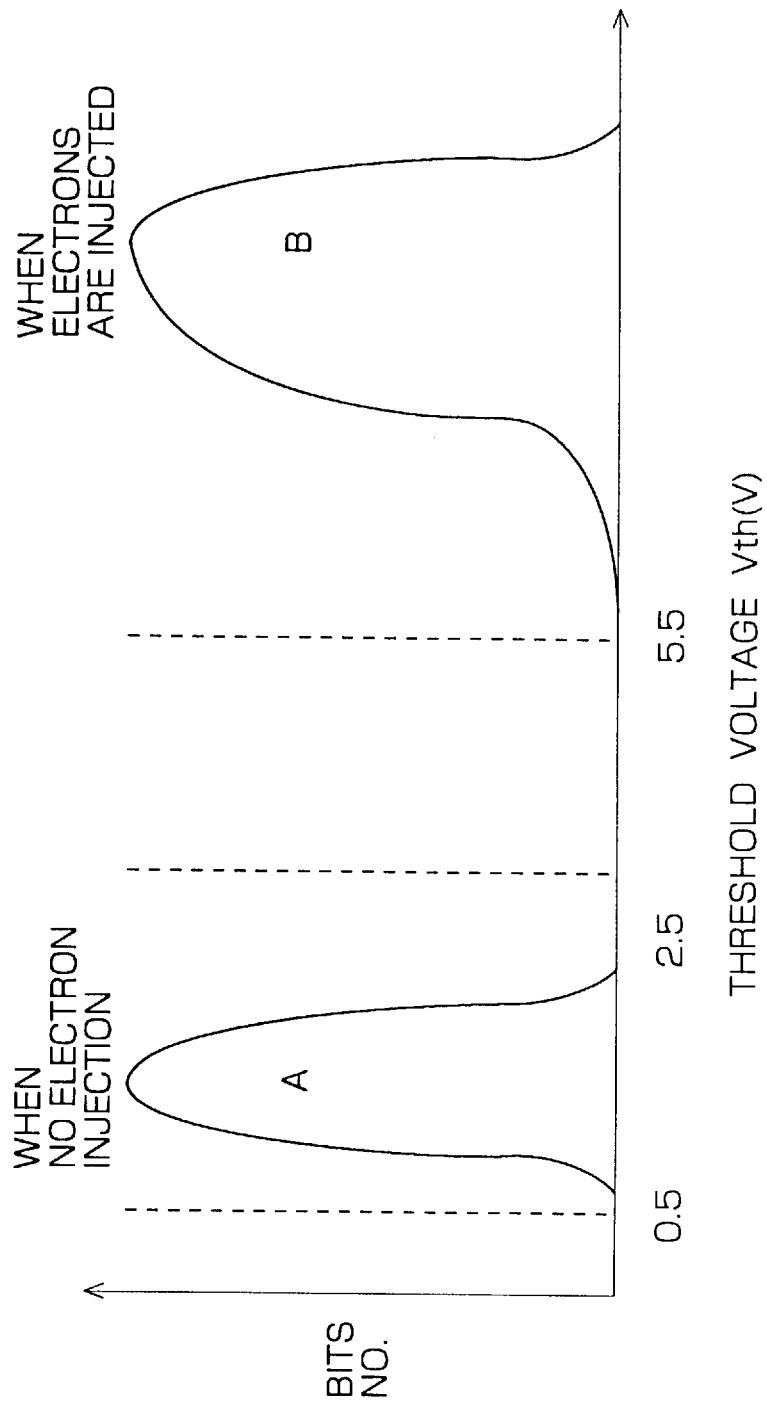

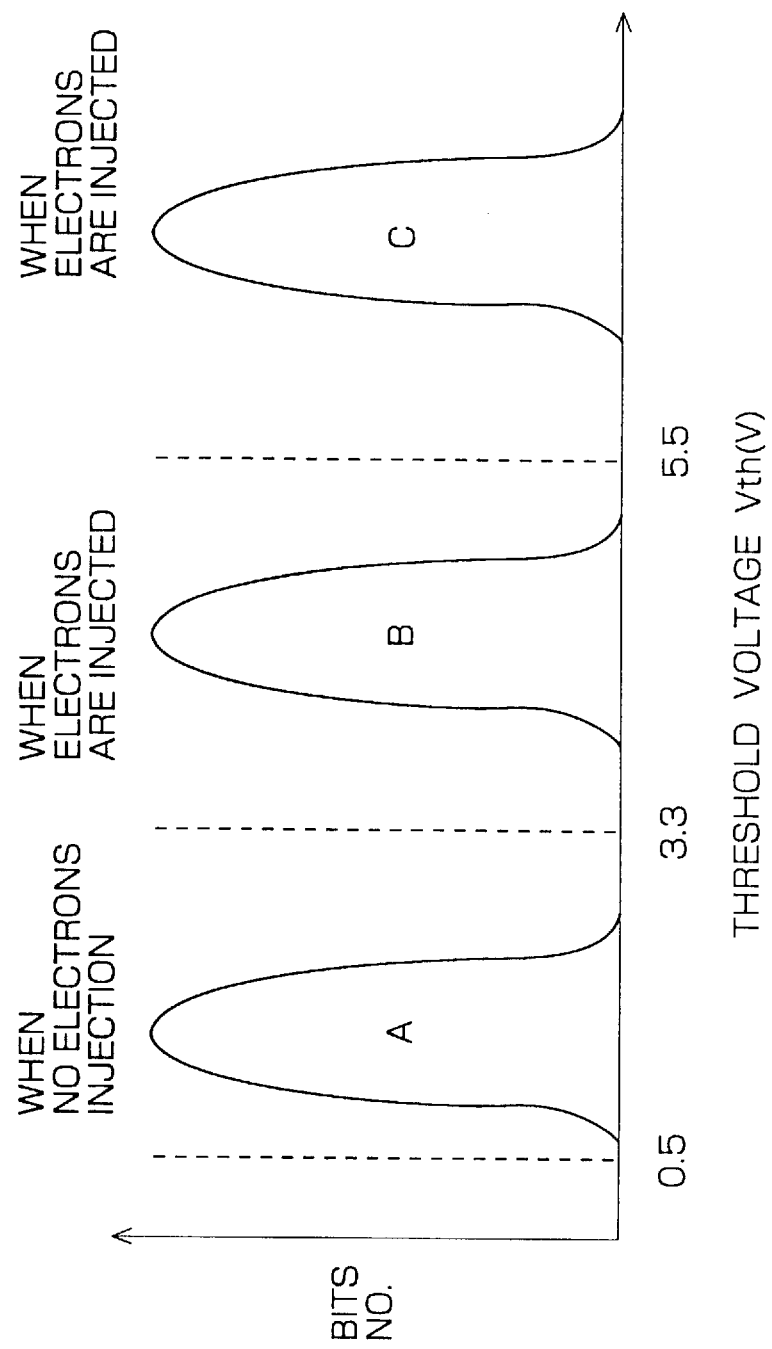

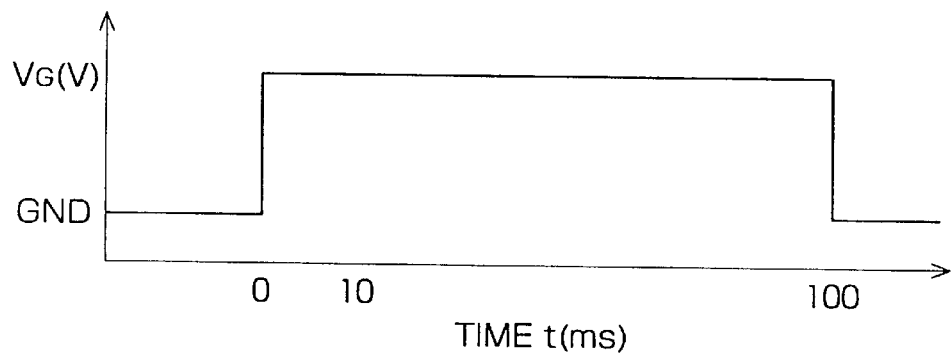
FIG. 12A PRIOR ART
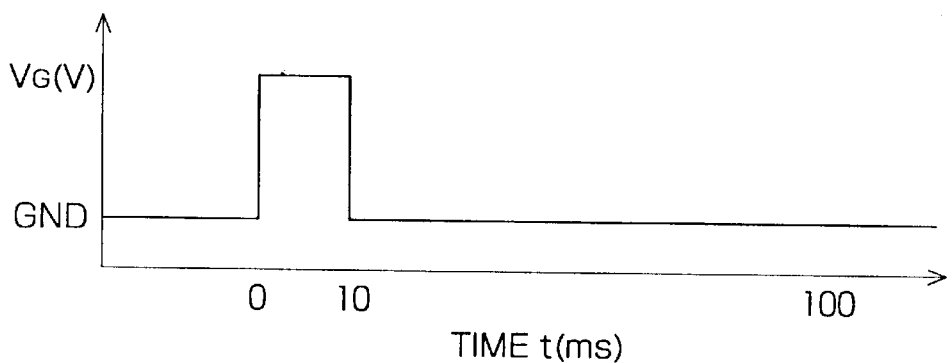
FIG. 12B PRIOR ART

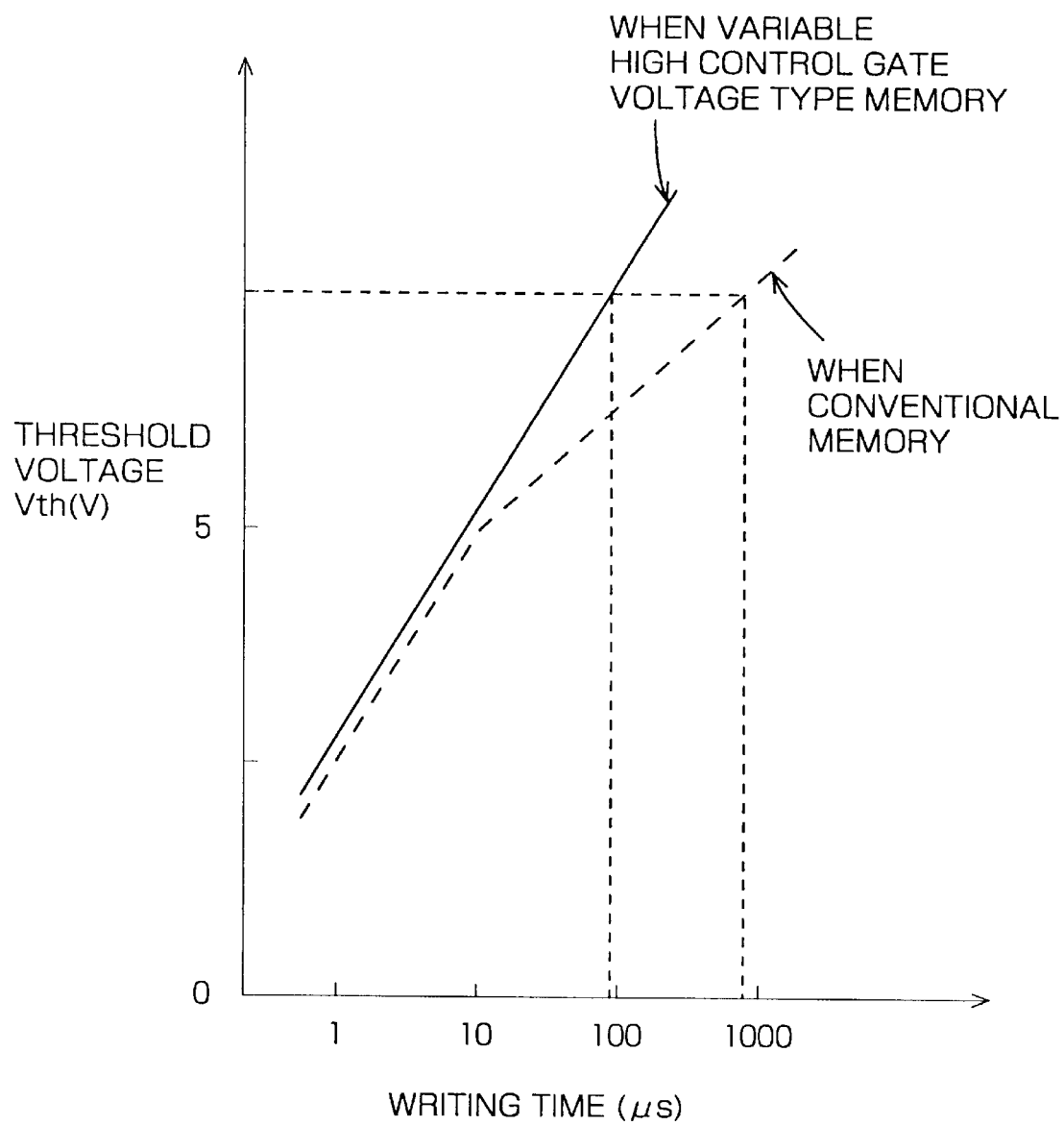

MEMORY HAVING CHARGE-CARRYING FLOATING GATE MEMORY CELLS WITH TIME/VOLTAGE DEPENDENT REFRESH

BACKGROUND OF THE INVENTION

1. Field of the Invention

The present invention relates to an electrically erasable programmable read only memory (EEPROM or $E^2PROM$), flash EEPROM, or other rewritable (multi-level) non-volatile memory device, which can electrically control a threshold level by storing charges in for example a floating gate.

2. Description of the Related Art

In a memory which has floating gates and can electrically rewrite data, for example, an EEPROM or a flash EEPROM, it is possible to change the threshold voltage of the memory cells and thereby store data by injecting or releasing charges to and from the floating gates. Heretofore, several different specifications of this type of memory device have been proposed with different methods of injecting or releasing the charges to or from the floating gates or methods of arrangement of the memory cells.

In a memory cell having a floating gate, in general, electrons are injected into the floating gate to set the threshold voltage, but when the memory cell is left alone after the threshold voltage has been set, the electrons accumulated in the floating gate are lost with the passage of time and a change occurs in the threshold voltage.

Further, the shift of the threshold voltage in the initial stage of writing is small when just raising the voltage applied to the control gate of the memory cell, therefore the writing speed has been slow.

SUMMARY OF THE INVENTION

An object of the present invention is to provide a non-volatile memory device which can prevent loss of data recorded due to a shift in the threshold voltage along with time and in turn can record a greater amount of information without increasing the size of the memory device. Another object of the present invention is to provide a non-volatile memory which can handle different power supply voltages and further can write at a high speed.

According to a first aspect of the present invention, there is provided a non-volatile memory device provided with a memory cell having a charge storage layer with a threshold voltage which changes in accordance with an amount of charge stored wherein one value from among the data of a plurality of values is written into the memory cell, comprising an auxiliary internal power source; a means for adjusting an amount of charges stored by the charge storage layer in accordance with a state of application of the voltage; a time counting means for counting a time elapsed from when a final write operation is carried out with respect to the memory cell; and a refreshing means for comparing the time counted by the counting means and a preliminarily set charge holding time limit, supplying the voltage of the auxiliary internal power source to the memory cell when the counted time reaches the charge holding time limit, and performing a repeat write operation.

The non-volatile memory device of the present invention adjusts the amount of charge stored by the charge storage layer in accordance with the state of application of a power supply voltage, and writes a single data value from a plurality of possible values in the memory cell. The time counting means counts the elapsed time from when a final write operation is carried out on the memory cell. The refreshing means compares the time counted by the counting means and a preliminarily set limit charge holding time limit, supplies the voltage of the auxiliary internal power source to the memory cell when the time counted reaches the charge holding time limit, and performs a repeat write operation.

Preferably, the value of the data written into the memory cell is at least a binary value.

Preferably, the repeat write operation by the refreshing means is carried out in units of sectors.

According to a second aspect of the present invention, there is provided a non-volatile memory device provided with a memory cell having a charge storage layer with a threshold voltage which changes in accordance with an amount of charge stored wherein one value from a plurality of possible values is written into the memory cell, comprising a plurality of power sources having different supply voltage values; a means for adjusting the amount of charge stored by the charge storage layer in accordance with a state of application of the voltage; and a means for selecting one power source among the plurality of power sources and supplying its voltage to the memory cell for a time in accordance with the value of that power source.

By the above configuration, the time elapsed from when the final write operation is carried out in each memory chip or each memory sector is obtained by the counting means. Then, this elapsed time and the preliminarily set charge holding time limit are compared. When the counted time reaches the charge holding time limit, a repeat write operation is carried out with respect to each memory chip or memory sector based on the power supply voltage of the auxiliary power source.

Further, when performing the write operation, the threshold voltage of the memory cell is adjusted so as to write one value of data from among data of three or more values in the memory cell and thereby realize a so-called multi-valued memory.

Further, when the repeat write operation is carried out with respect to the memory cell by a refresh functional block, the repeat write operation is carried out in units of memory sectors.

Further, where a plurality of power sources having different voltages are provided, the write operation is carried so that the writing time is a function of each power supply voltage. By this, a memory cell having a predetermined threshold voltage is obtained.

Preferably, in the first and second aspects, the memory cell has a floating gate and a control gate and charges are stored in the floating gate.

Preferably, in the memory cell, the control gate is arranged on a semiconductor substrate via an insulating film having a charge storage trap.

More preferably, the voltage applied to the control gate is variable.

BRIEF DESCRIPTION OF THE DRAWINGS

These and other objects and features of the present invention will become clearer from the following description of the preferred embodiments given with reference to the appended drawings, in which:

FIG. 2 is a view of a distribution of the threshold voltage before and after an injection of electrons into a floating gate of the memory cell shown in FIG. 1A;

FIG. 3 is a view of the distribution of the threshold value of the memory cell in which multi-valued data are written by adjusting the injected electrons;

FIG. 4 is a view of a shift of the threshold voltage with respect to the time during which the memory cell is left alone;

FIG. 5 is a view of the change of the distribution of the threshold voltage in a memory cell in which binary data is written while the memory cell is left alone;

FIG. 11 is a view of the distribution of the power supply voltage and the threshold voltage;

FIG. 12A is a view of a write pulse waveform where the power supply voltage is 5.5 V;

FIG. 12B is a view of the write pulse waveform where the power supply voltage is 3.3 V;

FIG. 14 is a view of the relationship between the writing time and the threshold voltage when a variable voltage is applied to the control gate at the time of a write operation.

DESCRIPTION OF THE PREFERRED EMBODIMENTS

Figure 1A:
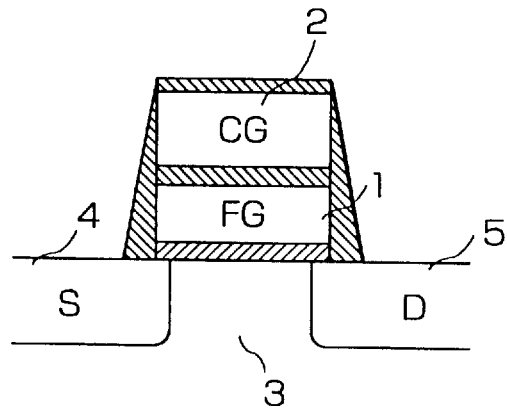
FIG. 1A is a simple sectional view of a memory cell.

FIG. 1A is a simple sectional view of a memory cell showing an example of the basic configuration of an erasable non-volatile memory device.

In FIG. 1A, 1 denotes a floating gate (FG), 2 denotes a control gate (CG), 3 denotes a substrate, 4 denotes a source diffusion layer (hereinafter, referred to as a source), 5 denotes a drain diffusion layer (hereinafter, referred to as a drain), and e-denotes a charge (electrons) injected into the floating gate 1, respectively. Note that, here, it is assumed that for example the source 4 and the drain 5 are the n-type, and the substrate 3 is a p-type. Write and read operations of the memory cell of FIG. 1A will be explained below.

Figure 1B:
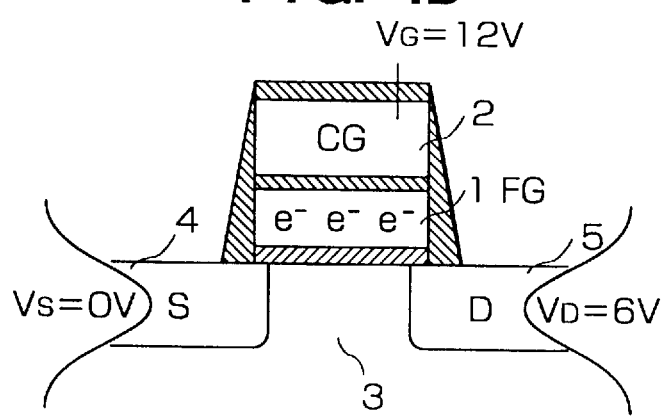
FIG. 1B is a view for explaining a write operation of data in the memory cell shown in FIG. 1A.

In a memory cell constituted in this way, the write operation of the data is carried out by, as shown in FIG. 1B, applying a voltage of a high level, for example, a voltage $V_G$, of 12 V, to the control gate 2, applying a voltage $V_D$ of for example 6 V to the drain 5 of the memory cell, and applying a ground potential (0 V) to the source 4.

When the memory cell is biased in this way, the memory cell assumes its ON state, a current flows from the drain 5 of the memory cell toward the source 4, and the electrons flow in an inverse direction to this, i.e., from the source 4 of the memory cell toward the drain 5. The part of the electrons accelerated in a pinch-off region in the vicinity of the drain 5 become channel hot electrons (CHE) which are trapped by the floating gate 1. Namely, the part of the electrons which become the hot electrons are stored in the floating gate 1.

As described above, the electrons are injected into the floating gate 1. Here, the amount of electrons injected into the floating gate 1 is determined by the voltage of the floating gate 1 or the time of application of an injection voltage. When the electrons are injected into the floating gate 1, the threshold voltage $V_{th}$ of a transistor of a memory cell which is controlled by the control gate 2 rises. Correspondence is established with the "1" or "0" level in accordance with the threshold voltage $V_{th}$.

FIG. 2 is a view of the distribution of the threshold voltage $V_{th}$ of the memory cell in a case where the electrons are injected into the floating gate 1 and a case where they are not injected. In actuality, there is a certain amount of variation in the threshold voltages $V_{th}$ of the memory cells. When taking into account this variation, it can be considered that the threshold voltage $V_{th}$ of a memory cell exhibit a distribution as shown in FIG. 2.

FIG. 2 shows the change of the threshold voltage $V_{th}$ of a memory cell by injecting electrons into the floating gate 1 when for example the power supply voltage $V_{cc}$ of the memory circuit is 5 V. In FIG. 2, the abscissa indicates the threshold voltage $V_{th}$, and the ordinate indicates the total number (number of bits) of memory cells. Further, in FIG. 2, A indicates a region of distribution of the threshold voltage of the memory cell in which electrons are not injected into the floating gate 1, and B indicates the region of distribution of the threshold voltage of the memory cell in which electrons are injected into the floating gate 1, respectively.

Here, for example, in a memory cell in which electrons are not injected into the floating gate 1, the threshold voltage $V_{th}$ thereof becomes 2.5 V or less. On the other hand, in a memory cell in which electrons are injected into the floating gate 1, the threshold voltage $V_{th}$ thereof rises to 5.5 V or more. Namely, the threshold voltage $V_{th}$ of a memory cell in which electrons are injected into the floating gate 1 becomes higher than the power supply voltage $V_{cc}$.

In a memory cell having a threshold voltage $V_{th}$ exhibiting such a distribution, for example, when a voltage $V_G$ of 2.5 V to 5.5 V is applied to the control gate 2, a memory cell in which electrons are not injected into the floating gate 1 assumes its ON in state, and a read current flows. On the other hand, a memory cell in which electrons are injected into the floating gate 1 assumes its OFF state, and a read current does not flow. The existence of this read current is detected by using a sensing circuit and is recognized as the "0" or "1" level. The data recorded in the memory cell can be read by the difference of the on-off state accompanying the injection of electrons into the memory cell in this way.

Figure 1C:
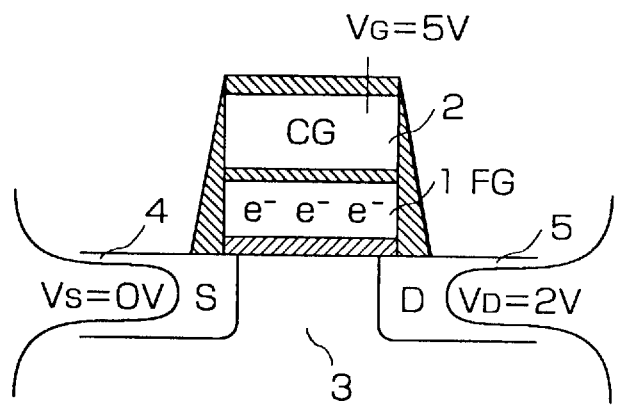
FIG. 1C is a view for explaining a read operation of the data in the memory cell shown in FIG. 1A.

Specifically, data is read from the memory cell, as shown in FIG. 1C, by applying a voltage of a high level, for example, a voltage of 5 V, to the control gate 2, applying a voltage of a low level, for example, a voltage of 2 V, to the drain 5, and applying a ground potential to the source 4 of the memory cell.

When the memory cell is biased in this way, it is determined whether or not a read current flows through the memory cell according to whether or not the electrons are injected into the floating gate 1. Here, for example, when a memory cell in which electrons are not injected into the floating gate 1 at the write operation is biased as in FIG. 1C, the memory cell assumes its ON in state and a read current flows. On the other hand, where electrons are injected into the floating gate 1 at the write operation, the threshold voltage of the memory cell rises, therefore even if the memory cell is biased in this way, the memory cell remains in the OFF state as it is, and the read current does not flow.

Accordingly, by detecting the voltage drop by this read current by a sensing circuit connected to an electrode of the drain 5 and outputting the same, the data stored in the memory cell can be read.

In general, the threshold voltage $V_{th}$ of the memory cell is shifted by a large extent by a low applied voltage in a short writing time at the time of rewriting. On the other hand, the holding characteristic of the floating gate 1 when left alone for a long time or at the time of a read operation is important as well.

The floating gate 1 electrically floats. The periphery thereof is electrically insulated by a silicon oxide film, therefore the electrons which are once injected into the floating gate 1 are held for a long time.

In recent years, a so-called multi-level (multi-valued) memory has been proposed in which the amount of the electrons injected into the floating gate 1 is adjusted so as to try to store as much information in one memory cell as possible. FIG. 3 is a view of the distribution of the threshold voltage $V_{th}$ of a memory cell written using this technology.

In FIG. 3, the region of distribution of the threshold voltage of the memory cell where no electrons at all are injected into the floating gate 1 of the memory cell and the threshold voltage $V_{th}$ of the memory cell does not rise is defined as A, the region of distribution of the threshold voltage of the memory cell where a small amount of electrons is injected into the floating gate 1 and the threshold voltage $V_{th}$ of the memory cell slightly rises is defined as B, the region of distribution of the threshold voltage of the memory cell where a slightly larger amount of electrons than this is injected into the floating gate 1 of the memory cell and the threshold voltage $V_{th}$ of the memory cell rises to a certain extent is defined as C, and further the region of distribution of the threshold voltage of the memory cell where a large amount of electrons is injected into the floating gate 1 of the memory cell and the threshold voltage $V_{th}$ of the memory cell greatly rises is defined as D.

As shown in FIG. 3, in the region A, the threshold voltage $V_{th}$ of the memory cell is spread within a range of from 0.5 V to 1.5 V; in the region B, the threshold voltage $V_{th}$ of the memory cell is spread within a range of from 2.0 V to 3.0 V; in the region C, the threshold voltage $V_{th}$ of the memory cell is spread within a range of from 3.5 V to 4.5 V; and in the region d, the threshold voltage $V_{th}$ of the memory cell is spread within a range of 5.5 V or more, respectively. By this, it is possible to record a larger amount of information, for example, data of four values, in one memory cell and thereby realize a so-called multi-level memory.

As stated earlier, in general, when electrons are injected into a floating gate of a memory cell, the threshold voltage $V_{th}$ of the memory cell is raised to the predetermined value, and then the memory cell is left alone, a change (transition) occurs in the threshold voltage $V_{th}$ of the memory cell with the passage of time. FIG. 4 is a graph showing the state of the change of the threshold voltage $V_{th}$ of the memory cell with the passage of time.

The cause of this change lies in the fact that the electrons injected into the floating gate 1 of the memory cell are released from the floating gate 1 with the passage of time. As shown in FIG. 4, when the elapsed time of the memory cell reaches $t_0$, the threshold voltage $V_{th}$ of the memory cell will change by the amount of $\Delta V_{th}$, for example, be lowered.

An explanation will next be made of the change of the threshold voltage $V_{th}$ of the memory cell referring to FIG. 5 and FIG. 6. According to FIG. 5 and FIG. 6, due to the electrons being released from the floating gate 1 of the memory cell along with the passage of time, the threshold voltage $V_{th}$ of the memory cell shifts downward, that is, the threshold voltage $V_{th}$ tends to be lowered. In the case of a conventional binary memory, when the power supply voltage is sufficiently high, as shown in FIG. 5, there is a sufficient margin in the threshold voltage $V_{th}$, therefore even if the threshold voltage $V_{th}$ is slightly lowered, there is a small influence exerted upon the reading of the recorded information.

Figure 6:
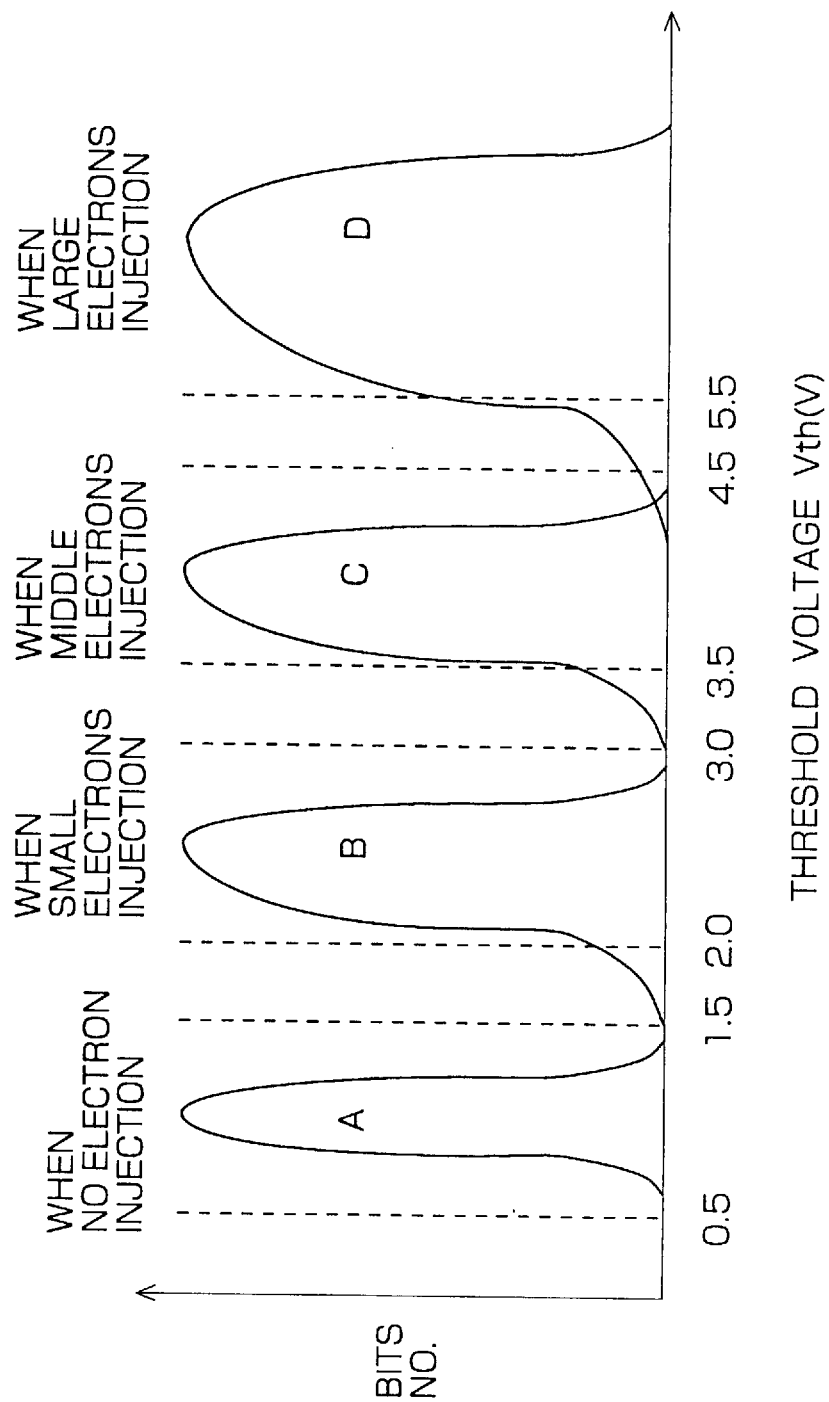
FIG. 6 is a view of the change of the distribution of the threshold voltage in a memory cell in which four-value data is written while the memory cell is left alone.

When it is intended to record information of three or more levels in one memory cell, as shown in FIG. 6, the margin in the threshold voltage $V_{th}$ becomes very small and the reduction of the $V_{th}$ due to the downward shift of the threshold voltage $V_{th}$ caused by the cell being left alone is no longer negligible. Namely, the shift of the threshold voltage $V_{th}$ causes the threshold voltage representing the predetermined information to be lowered and enter into the region of distribution of a threshold voltage representing another value. At the time of a read operation, this change causes the data to be converted to other data.

On the other hand, even in the case of a binary memory, there sometimes arises a case where a sufficient margin cannot be ensured in the threshold voltage $V_{th}$ due to the lowering of the power supply voltage. For this reason, when the memory is left alone, the threshold voltage $V_{th}$ shifts downward and a threshold voltage $V_{th}$ representing a predetermined value enters into the region of a threshold voltage representing other data and there is a possibility that data incorrect will be read at the time of a read operation.

Figure 7A:
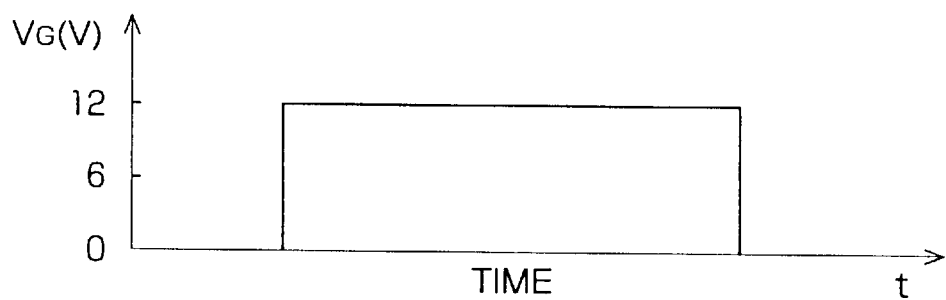
FIG. 7A is a waveform diagram of a pulse applied to a control gate of the memory cell in a write operation.
Figure 7B:
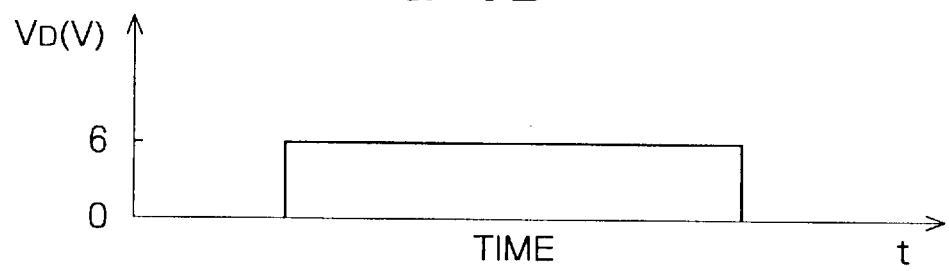
FIG. 7B is a waveform diagram of a pulse applied to a drain electrode of the memory cell in a write operation.
Figure 8:
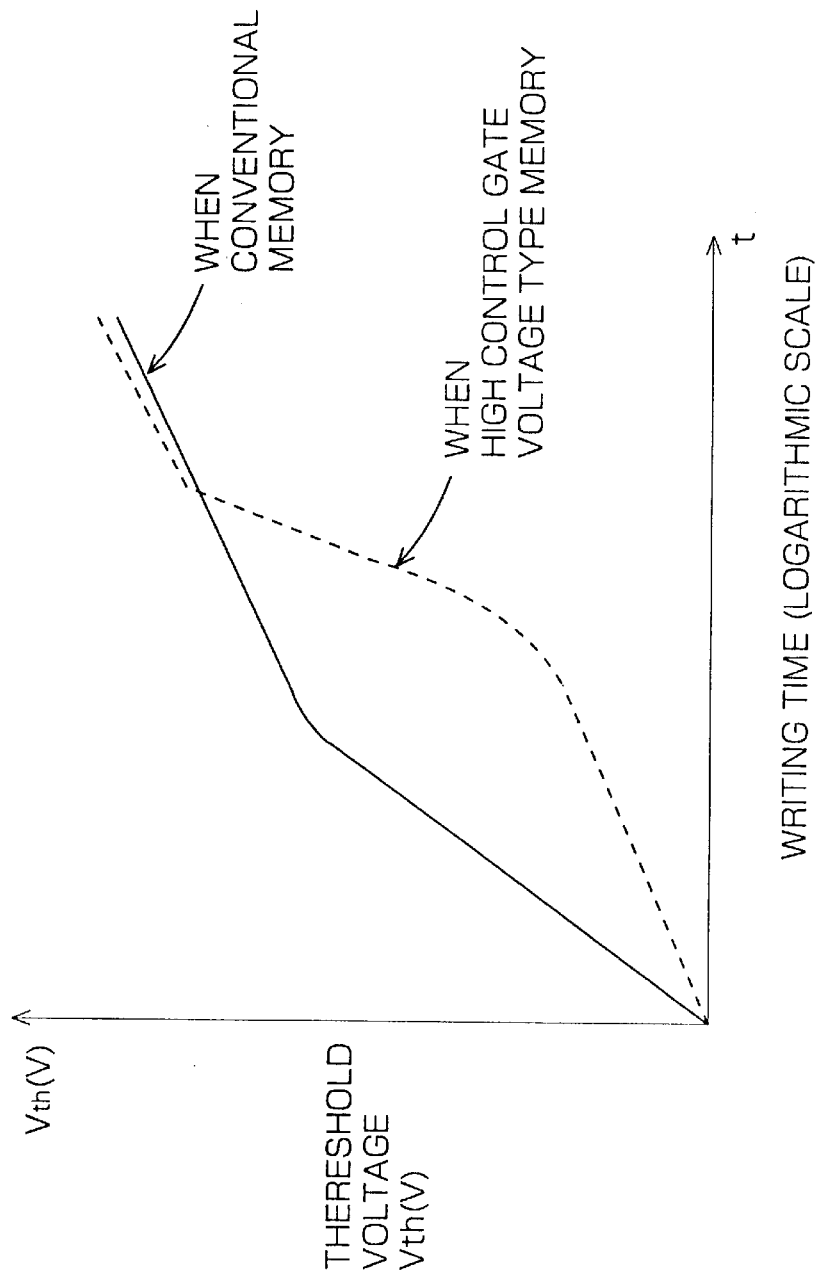
FIG. 8 is a view of the relationship between a writing time and a threshold voltage where the data is written by applying a fixed voltage to the control gate.

Another problem occurs when injecting electrons into the floating gate of a memory cell, that is, when writing data. Explaining this more specifically, when writing in a memory cell, for example, as shown in FIG. 1B, the memory cell is biased. Namely, by applying a pulse $V_G$ of a high voltage, for example 12 V, to the control gate 2 of the memory cell and simultaneously bringing the source 4 of the memory cell to the ground potential and applying a pulse $V_D$ of a high voltage, for example 5 V to the drain 5 of the memory cell, electrons are injected into the floating gate 1. FIG. 7A and FIG. 7B are waveform diagrams showing the pulses applied to the control gate 2 and drain 5 of the memory cell, respectively.

In general, by making the level of the voltage $V_G$ applied to the control gate 2 of the memory cell high, the injection time of the electrons to the floating gate 1 can be shortened. However, if the level of the voltage $V_G$ applied to the control gate 2 is merely raised, the writing speed becomes slow in the initial stage of the write operation.

Figure 9:
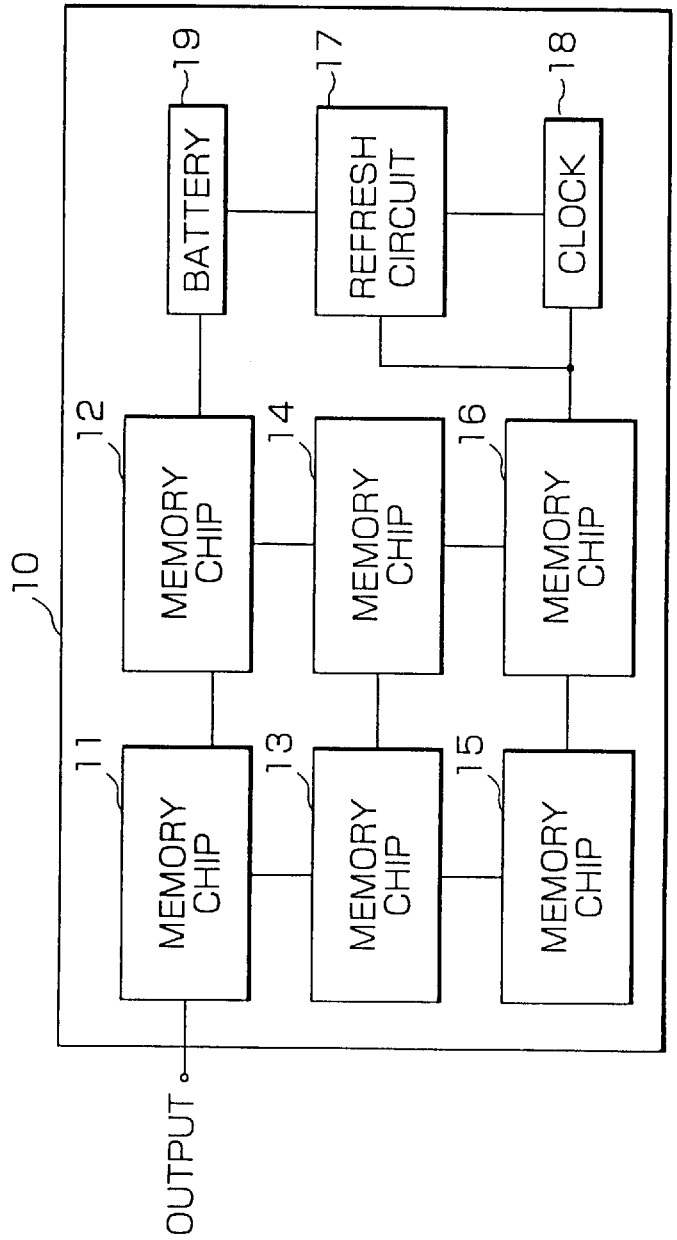
FIG. 9 is a block diagram of an embodiment of a non-volatile memory device according to the present invention.

FIG. 9 is a circuit diagram of a preferred embodiment of a non-volatile memory device according to the present invention.

In FIG. 9, 10 denotes a non-volatile memory device, 11 to 16 denote memory chips comprised of flash EEPROMs each having a cell structure having a floating gate, 17 a refresh functional block having a refresh function, 18 a clock functional block supplying a clock to the respective memory chips 11 to 16 and the refresh functional block 17, and 19 denotes a battery serving as an auxiliary internal power source, respectively. It is possible to store binary or more data, for example, data of 4 values, in each of the memory cells of the memory chips 11 to 16. Namely, the memory chips 11 to 16 are multi-level memories.

The refresh functional block 17 records the time in which the final write operation is carried out for every memory chip or every memory sector, counts the time elapsed from when the final write operation is carried out for every memory chip or every memory sector by a clock supplied from the clock functional block 18, and compares this elapsed time and the preliminarily set charge holding time limit. When the elapsed time reaches the charge holding time limit, it issues a command to perform a repeat write operation on the memory chip or the memory sector.

The clock functional block 18 supplies a clock signal having a stable cycle to the refresh functional block 17 so as to count the elapsed time.

The battery 19 serves as the internal power source and supplies the power supply voltage necessary for the operation of the refresh functional block 17 and the clock functional block 18 even if the external power supply of the non-volatile memory device 10 is turned off. For this reason, the non-volatile memory device 10 does not depend upon the external power supply and the refresh operation is guaranteed by the supply of the power supply voltage of the battery 19.

Further, it is also possible for each memory cell or each memory sector to store data representing the final writing time and the preliminarily set charge holding time limit in a dedicated memory provided with a refresh functional block or store the same in a predetermined memory region in the memory chips 11 to 16.

Note that, the limit charge holding time limit, that is, the time of garbling of data stored in the memory cell, can be easily estimated from the characteristics of the change of the threshold voltage $V_{th}$ of the memory cell when left alone after performing a write operation on the memory cell, that is, the graph shown in FIG. 4 indicating the relationship between the change of the threshold voltage $V_{th}$ and the time passage of. The result of this estimation is preliminarily stored in a memory existing in the refresh functional block 17 or the memory chips 11 to 16 in predetermined memory regions as the charge holding time limit of the memory cell and is used for determining whether or not the refresh operation is to carried out on the respective memory chips 11 to 16 or the memory sectors.

Namely, the time elapsed from when the final write operation is carried out is compared with the preliminarily set charge holding time limit of the memory cell in units of the memory chips or memory sectors. If the elapsed limit reaches the charge holding time of the memory cell, a command is issued to the memory chip or the memory sector to perform a refresh operation. By doing this, the data stored in the memory chips 11 to 16 no longer become garbled with the elapse passage of time, and the reliability of the memory device is enhanced.

Figure 10:
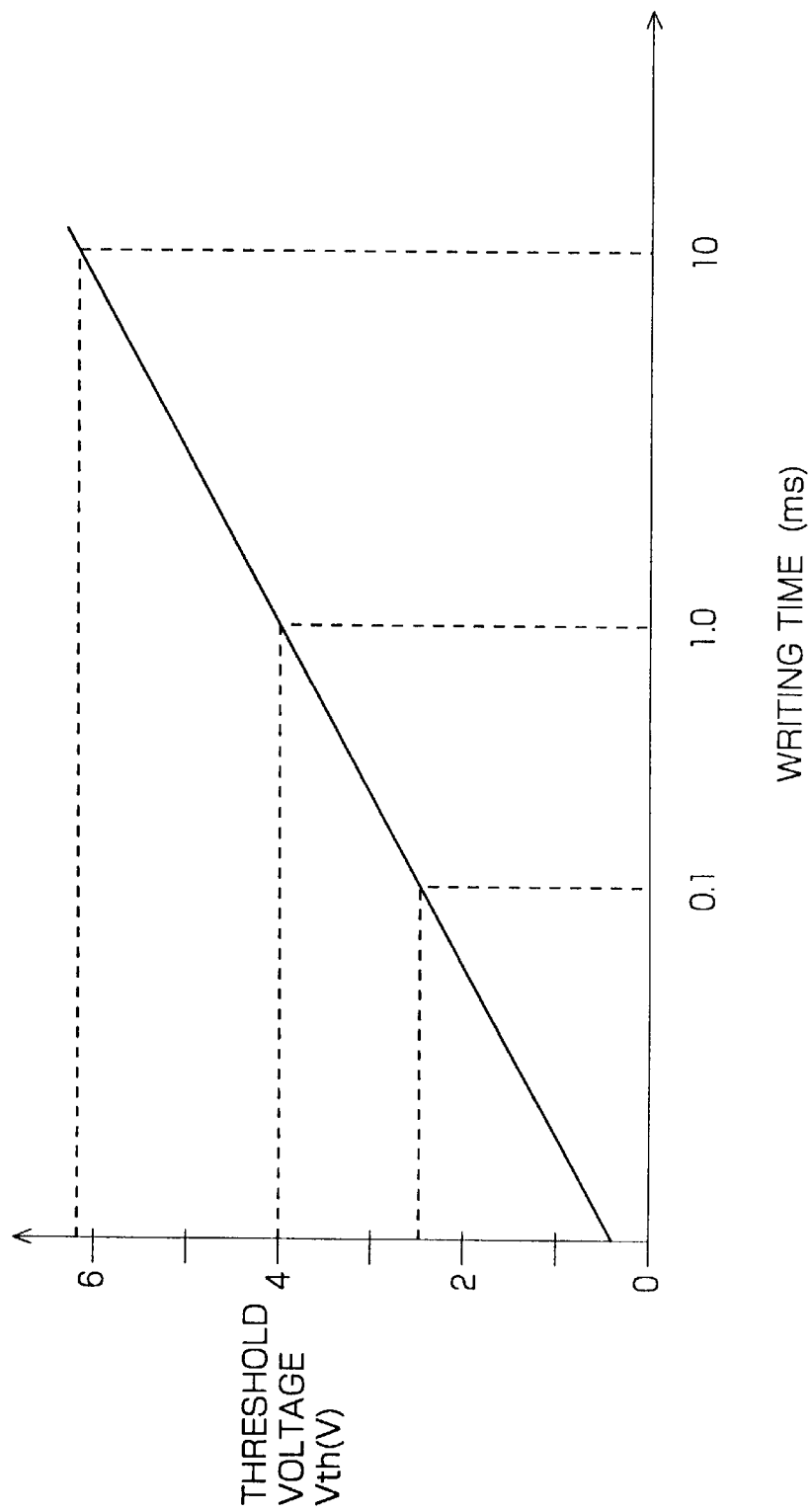
FIG. 10 is a view of the relationship between the threshold voltage and the writing time.

Further, as a method of adjusting the amount of electrons injected into the floating gate with respect to one memory cell, use is made of the dependency of the threshold voltage $V_{th}$ and the time of application of a high voltage at the time of a write operation. The dependency of the threshold voltage $V_{th}$ and the time of application of a high voltage is shown in the graph of FIG. 10. In this figure, the abscissa indicates time represented by a logarithmic scale, and the ordinate indicates the threshold voltage $V_{th}$ of the memory cell.

Note that, the graph shown in FIG. 10 is for data where a voltage of 12 V is applied to the control gate. In actuality, this data changes by the voltage applied to the control gate or by the memory device and the state of use.

As shown in FIG. 10, for example, a writing time of 0.1 ms results in a threshold voltage of the memory cell of about 2.5 V, a writing time of 1.0 ms results in a threshold voltage of the memory cell of about 4.0 V, and further a writing time of 10 ms results in a threshold voltage of the memory cell of about 6 V.

When utilizing the dependency of the threshold voltage of the memory cell and the writing time to inject electrons into the floating gate 1, an adjustment circuit (not specifically shown) makes it possible to adjust the injection time, that is, the writing time, so as to obtain a predetermined threshold voltage $V_{th}$. By this, the amount stored in electrons of the floating gate 1 can be adjusted to any value, that is, the threshold voltage $V_{th}$ of the memory cell can be adjusted to any value as a function of the write time, recording of data of three or more values in one memory cell becomes possible, and a so-called multi-valued memory can be realized.

Further, when the memory device operates under a number of different power supply voltages, it is necessary to set the threshold voltage $V_{th}$ of the memory cell in accordance with each power supply voltage level. By setting a writing time corresponding to each voltage level by utilizing the dependency of the threshold voltage of the memory cell and the time of application of the high voltage at the time of a write operation as mentioned above, the threshold voltage $V_{th}$ of the memory cell can be set to different values. Namely, the memory device can operate with a number of power supply voltages.

For example, as shown in FIG. 11, when the power supply voltage is 3.3 V, the write operation is carried out so that the threshold voltage of the memory cell falls in the region B. On the other hand, when the power supply voltage becomes 5.5 V, the write operation is carried out so that the threshold voltage of the memory cell falls in the region C.

FIG. 12A and FIG. 12B are waveforms of a high voltage pulse applied to the control gate 2 of the memory cell at the time of a write operation when the power supply voltage is for example 5.5 V and 3.3 V. When performing the write operation, a predetermined threshold voltage is obtained by applying a high voltage pulse for the write operation to the control gate 2 of the memory cell for a writing time in accordance with the power supply voltage. For example, when the power supply voltage is 5.5 V, the time of application of the write pulse to the control gate 2 for the write operation is set to 100 ms as shown in FIG. 12A so the threshold voltage of the memory cell falls in the region C of FIG. 11 and the power supply voltage of 5.5 V can be handled.

Further, when the power supply voltage is 3.3 V, the time of application of the write pulse to the control gate 2 for the write operation is set to 10 ms as shown in FIG. 12B so that the threshold voltage of the memory cell falls in the region B of FIG. 11 and the power supply voltage of 3.3 V can be handled.

By this, the write pulse is applied to the control gate of the predetermined memory cell exactly for a writing time in accordance with the power supply voltage and the threshold voltage of the memory cell is adjusted, so different power supply voltages can be handled. Further, in the case of a low power supply voltage, the writing time can be shortened.

Further, when injecting electrons into the floating gate 1 of the memory cell, the voltage applied to the control gate 2 is adjusted so that the amount of injected electrons becomes always the maximum, whereby the threshold voltage $V_{th}$ of the memory cell can be raised to the predetermined voltage level by a short injection time.

Figure 13A:
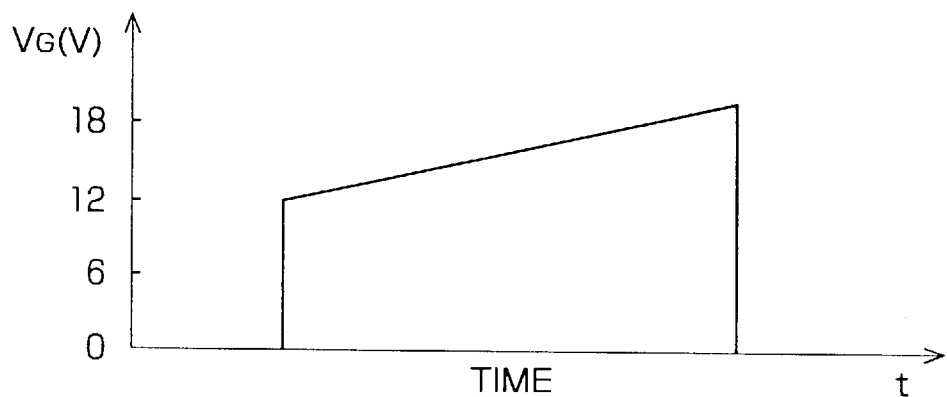
FIG. 13A is a waveform diagram of the control gate voltage when a variable voltage is applied to the control gate at the time of a write operation.
Figure 13B:
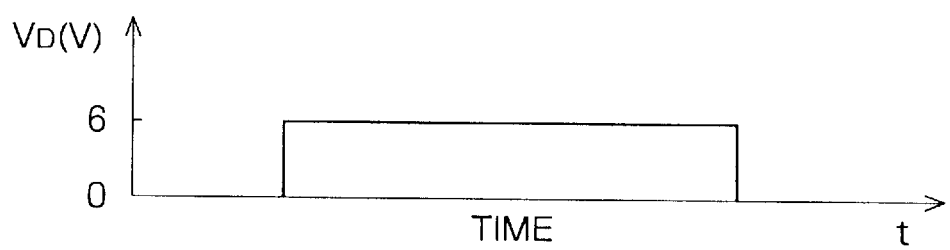
FIG. 13B is a waveform diagram of the drain voltage when a variable voltage is applied to the control gate at the time of a write operation.

In the present embodiment, since the amount of injected electrons can be always held at the maximum when injecting the electrons into the floating gate 1 by applying a high variable-voltage pulse as shown in FIG. 13A to the control gate 2, the injection time of electrons to the floating gate 1 can be made short. FIG. 13B shows the waveform of a drain voltage at this time which is similar to the voltage waveform in FIG. 7B.

FIG. 14 shows the result of a comparison between the time of injection of electrons to the floating gate 1 by the voltage-variable pulse shown in FIG. 13A and the time of injection of electrons by the fixed voltage pulse shown in FIG. 14. According to FIG. 7A, the time of injection of electrons into the floating gate 1 by a variable pulse to raise the threshold voltage $V_{th}$ of the memory cell up to the predetermined level is shorter by approximately one order of magnitude than the time of injection of the electrons by a conventional fixed pulse. Namely, there is the advantage that it is possible to inject electrons into the floating gate 1 by the voltage-variable pulse of the present embodiment in a relatively short time.

Here, an explanation will be made of the overall operation of the non-volatile memory device 10. Usually, in the non-volatile memory device 10, the write and read operations with respect to the memory chips 11 to 16 are carried out by the external power supply voltage. After the write operation is carried out, the time during which the write operation was carried out is stored in the predetermined memory for every memory chip or every memory sector by the refresh functional block 17.

On the other hand, when the non-volatile memory device 10 is left alone, the power supply voltage is supplied by the battery 19 serving as the internal power source so as to maintain the functions of the refresh functional block 17 and the clock functional block 18. Then, using a clock signal supplied from the clock functional block 18, the time elapsed from when the final write operation is carried out is counted for every memory chip or every memory sector. This elapsed time and the preliminarily set charge holding time limit are compared. When the result of the comparison shows that the elapsed time has reached the charge holding time limit a repeat write command is issued to the memory chip or the memory sector, a repeat write operation is carried out, and possible garbling of the data due to the elapse of time is prevented.

As mentioned above, according to the present embodiment, the memory device is provided with two or more, for example six, memory chips 11 to 16, a refresh functional block 17, a clock functional block 18, and a battery 19. The time elapsed from when the final write operation is carried out and the preliminarily stored charge holding time limit, that is, the time for garbling of the data, is compared for every memory chip or every memory sector existing in the memory chip. As a result of the comparison, a refresh command is issued with respect to each memory chip or memory sector existing in the memory chip. Therefore, even if the external power source is turned off, the refresh function is maintained by the internal battery 19 and the garbling of the recorded data due to a change in the threshold voltages $V_{th}$ of the memory chips 11 to 16 can be avoided.

Further, it is sufficient so far as the battery 19 provided in the memory device guarantees the clock function and a refresh operation executed at intervals of a few months or a few years for 10 years, therefore a battery having a much lower capacity than that of a back-up power source such as that of a conventional SRAM is satisfactory. Further, the refresh functional block 17 and the clock functional block 18 occupy a much smaller area than that by the memory chips 11 to 16, therefore there is almost never an increase of the layout area of the semiconductor device or the semiconductor system.

Further, by adjusting the time of application of the high voltage, that is, the writing time with respect to the floating gate, by utilizing the dependency of the threshold voltage of the memory cell and the writing time, a predetermined threshold voltage can be obtained. By this, two or more, for example four, values can be recorded in one memory cell, and a so-called multi-valued memory can be realized.

Further, by providing a plurality of power sources having different supply voltage values, dealing with the plurality of power supply voltages by utilizing the dependency of the threshold voltage of the memory cell and the writing time, and adjusting the threshold voltage of the memory cell in accordance with each power supply voltage level, a non-volatile memory device which can handle a plurality of power supply voltages can be realized.

Further, by applying a variable-voltage pulse to the control gate of the memory cell at the time of a write operation on the memory cell, the amount of injection of electrons to the floating gate is always held at the maximum, and the writing time can be made short.

The above explanation was made for a floating gate type memory cell, but it is true also for a memory cell of a type storing charges in a trap in the insulating film.

What is claimed is:

1. A non-volatile memory device including a memory cell having a charge storage layer with a threshold voltage which changes in accordance with an amount of charge stored in the charge storage layer, wherein one value from a plurality of values is written into said memory cell, said memory device comprising:

an auxiliary internal power source;

a means for adjusting an amount of charges stored by said charge storage layer as a function of the applied voltage;

means for determining the period of elapsed time from when a write operation is carried out with respect to said memory cell; and a refreshing means for comparing the elapsed time and a preliminarily set charge holding time limit, supplying the voltage of said auxiliary internal power source to said memory cell when the elapsed time reaches the charge holding time limit, and performing a repeat write operation on said memory cell.

2. A non-volatile memory device as set forth in claim 1, wherein said one value of the data written into said memory cell is at least a binary value.

3. A non-volatile memory device as set forth in claim 1, wherein said memory device includes a plurality of memory cells organized into memory cell sectors, the repeat write operation carried out by said refreshing means being carried out on a sector basis.

4. A non-volatile memory device as set forth in claim 1, wherein said memory cell has a floating gate and a control gate and charges are stored in the floating gate.

5. A non-volatile memory device as set forth in claim 1, wherein, in said memory cell, the control gate is arranged on a semiconductor substrate via an insulating film having a charge storage trap.

6. A non-volatile memory device as set forth in claim 4, wherein, in said memory cell, the control gate is arranged on a semiconductor substrate via an insulating film having a charge storage trap.

7. A non-volatile memory device including a memory cell having a charge storage layer with a threshold voltage which changes in accordance with an amount of charge stored in the charge storage layer, wherein one value from a plurality of values is written into said memory cell, said memory device comprising:

- a plurality of power sources having different supply voltage values;
- a means for adjusting the amount of charge stored by said charge storage layer as a function of the applied voltage; and
- means for determining the period of elapsed time from when a write operation is carried out with respect to said memory cell; and
- a refreshing means for comparing the elapsed time and a preliminarily set charge holding time limit, selecting one power source among said plurality of power sources, supplying the voltage of said selected power source to said memory cell for a selected time period that is a function of the supplied voltage from said selected power source when the elapsed time reaches the charge holding time limit, and performing a repeat write operation on said memory cell.

8. A non-volatile memory device as set forth in claim 7, wherein said memory cell has a floating gate and a control gate and charges are stored in the floating gate.

9. A non-volatile memory device as set forth in claim 7, wherein, in said memory cell, the control gate is arranged on a semiconductor substrate via an insulating film having a charge storage trap.

10. A non-volatile memory device as set forth in claim 9, wherein the voltage applied to said control gate is variable.

11. A non-volatile memory device including a memory cell having a charge storage layer with a threshold voltage which changes in accordance with an amount of charge stored in the charge storage layer, wherein one value from a plurality of values is written into said memory cell, said memory device comprising:

- an auxiliary internal power source;
- an adjustment circuit for adjusting an amount of charges stored by said charge storage layer as a function of the applied voltage;
- means for determining the period of elapsed time from when a write operation is carried out with respect to said memory cell; and
- a refreshing circuit for comparing the elapsed time and a preliminarily set charge holding time limit, supplying the voltage of said auxiliary internal power source to said memory cell when the elapsed time reaches the charge holding time limit, and performing a repeat write operation on said memory cell.

12. A non-volatile memory device including a memory cell having a charge storage layer with a threshold voltage which changes in accordance with an amount of charge stored in the charge storage layer, wherein one value from a plurality of values is written into said memory cell, said memory device comprising:

- a plurality of power sources having different supply voltage values;
- an adjustment circuit for adjusting the amount of charge stored by said charge storage layer as a function of the applied voltage; and
- a refreshing means for comparing the elapsed time and a preliminarily set charge holding time limit, for selecting one power source from among said plurality of power sources, supplying the voltage of said selected power source to said memory cell for a selected time period that is a function of the supplied voltage from said selected power source when the elapsed time reaches the charge holding time limit, and performing a repeat write operation on said memory cell.

* * * * *